United States Patent [19]

Kamisaka et al.

[11] Patent Number: 5,432,363

[45] Date of Patent: Jul. 11, 1995

[54] SOLID-STATE IMAGE PICKUP DEVICE AND MANUFACTURING METHOD OF THE SAME

[75] Inventors: Wataru Kamisaka, Takatsuki; Hiroyuki Okada, Osaka; Yuji Matsuda, Takatsuki, all of Japan

[73] Assignee: Matsushita Electric Industrial Co., Ltd., Kadoma, Japan

[21] Appl. No.: 344,416

[22] Filed: Nov. 23, 1994

Related U.S. Application Data

[63] Continuation of Ser. No. 11,380, Jan. 29, 1993, abandoned.

[30] Foreign Application Priority Data

Jan. 30, 1992 [JP] Japan .................. 4-014519

[51] Int. Cl.6 .............. H01L 29/78; H01L 27/14; H01L 31/00
[52] U.S. Cl. .................. 257/233; 257/249; 257/250; 257/229; 257/232
[58] Field of Search .......... 257/232, 233, 249, 250, 257/751, 754, 755, 767, 768, 229, 230

[56] References Cited

U.S. PATENT DOCUMENTS 5,202,282 4/1993 Son ........................ 437/53

FOREIGN PATENT DOCUMENTS

WO88/07767 10/1988 European Pat. Off. .
59-159564 9/1984 Japan .................. 257/232
60-38869 2/1985 Japan .

OTHER PUBLICATIONS

M. Yamagishi et al., "A 2 Million Pixel FIT-CCD Image Sensor for HDTV Camera Systems", *IEEE Transactions on Electronic Devices*, vol. 38, No. 5, pp. 976–978 (May 1991).

*Primary Examiner*—Mark V. Prenty
*Assistant Examiner*—John Guay
*Attorney, Agent, or Firm*—Ratner & Prestia

[57] ABSTRACT

Photoelectric converting parts and vertical CCD register parts are formed in a semiconductor substrate. Polysilicon electrodes are formed on the vertical CCD register parts. On the polysilicon electrodes, polysilicon oxide film and dielectric film are deposited. On the polysilicon electrodes, contact windows are formed by mask matching and etching. The contact windows are formed in the first polysilicon electrode and second polysilicon electrode so as to realize four-phase drive of the solid-state image pickup device. Polysilicon film and tungsten silicide film are formed thereon. By etching these films, a first wiring is formed. A second wiring of aluminum film is formed thereon through an interlayer dielectric film. Hence, a high transfer efficiency and a favorable smear noise characteristic are presented at low illumination.

8 Claims, 4 Drawing Sheets

SOLID-STATE IMAGE PICKUP DEVICE AND MANUFACTURING METHOD OF THE SAME

This application is a continuation of application Ser. No. 08/011,380, filed Jan. 29, 1993, now abandoned

BACKGROUND OF THE INVENTION

1. Field of the Invention

The present invention relates to a solid-state image pickup device used widely in video cameras and the like.

2. Description of the Related Prior Art

The solid-state image pickup device is widely used in video cameras and the like. As the body of the video camera becomes smaller in size and lighter in weight, the solid-state image pickup device is required to have higher resolution and higher performance. Especially in the case of the frame interline transfer system used in a professional camera, it has been desired to decrease the occurrence of smear noise. It has been difficult to satisfy all these requirements by the mere extension of the prior art.

A conventional solid-state image pickup device its described below by reference to a drawing.

Figure 11:
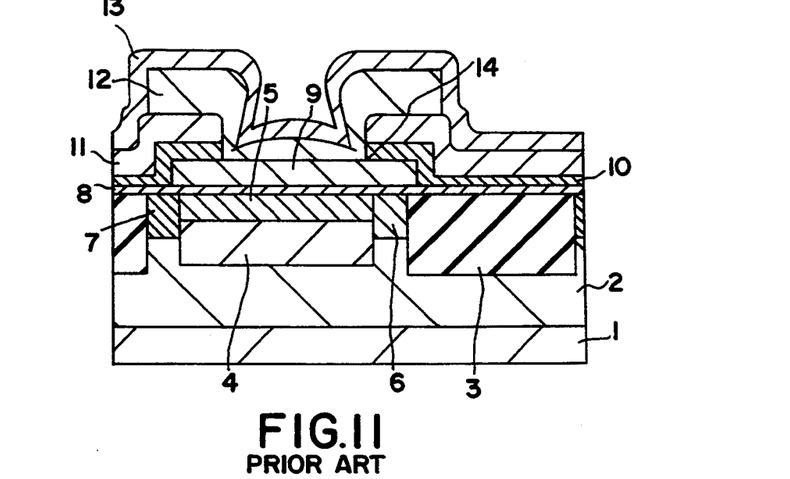
FIG. 11 is a diagram showing a sectional structural view of a conventional solid-state image pickup device.

In FIG. 11, in the n type semiconductor substrate 1, the p type well 2 and the $n^-$ diffusion layer region 3 form a photoelectric converting part. When the light enters the $n^-$ type diffusion layer region 3 an electron and hole pair is generated. Electrons are accumulated in the $n^-$ type diffusion layer region 3. When very strong light enters, electrons overflow from the $n^-$ type diffusion layer region 3. Excess electrons flow into the n type semiconductor substrate 1 which is applied with a positive voltage. This structure is called a vertical overflow drain structure. The vertical shift register for transferring signal charges, the n type diffusion layer region 4 (hereinafter called vertical CCD register part), forms a buried channel type transistor structure. By forming the p type diffusion layer region 5 in the periphery thereof, invasion of electrons from the photoelectric converting part of the p type well 2 is prevented.

The $p^+$ type diffusion layer region 6 can control the threshold value for transferring electrons from the photoelectric converting part to the vertical CCD register part. The $p^{++}$ type diffusion layer region 7 forms a junction and separates adjacent pixels. In actual driving, for example, a high voltage of 10 V is applied to the polysilicon electrode 9, and all electrons accumulated during photoelectric converting are transferred to the vertical CCD register part. Consequently, for example, by applying 0 V and − 10 V voltages alternately to the polysilicon electrode 9, the signal charges in the vertical CCD register part can be transferred sequentially.

The polysilicon electrode 9 is electrically insulated by the polysilicon oxide film 10. In its upper part, moreover, the interlayer dielectric film 11 of CVD film or the like is formed to insulate from the aluminum wiring. In the case of a solid-state image pickup device, the aluminum wiring also serves as the light-shield film. The aluminum film 12 is located in the upper part of the vertical CCD register part (polysilicon electrode 9), and prevents light from entering into the vertical CCD register part. Thus, in the conventional solid-state image pickup device, by forming the p type diffusion layer region 5 around the buried channel of the vertical CCD register part, invasion of electrons from the substrate inside is prevented. Besides, by forming the aluminum film 12 in the upper part of the polysilicon electrode 9, excess light is prevented to enter, thereby suppressing the occurrence of smear noise.

On the other hand, the contact window 14 is formed in a part of the polysilicon oxide film 10 and interlayer insulation film 11. Each polysilicon electrode 9 is lined by aluminum wiring. As a result, the driving speed of the solid-state image pickup device is enhanced. The driving pulse used in the solid-state image pickup device is applied from both ends of the polysilicon electrode 9 in the photoelectric converting part. Accordingly, in the middle of the photoelectric converting part, the waveform of a signal pulse is likely to deform. Hence, the transfer efficiency of a signal charge in that region is lowered. It is reported that the transfer efficiency of the signal charge is not lowered by improving the waveform of the driving pulses to be applied to the middle of the photoelectric converting part. Therefore, by lining with the aluminum wiring, deformation of capacity of the polysilicon electrode 9 can be suppressed, and as a result, the transfer efficiency can be enhanced.

In the prior art structure, however, in the bottom pare of the contact window 14 of the polysilicon electrode 9 and the aluminum wiring, the aluminum film having a high work function contacts with the polysilicon which has a low work function, so that a eutectic mixture is formed. At this time, the polysilicon electrode 9 is subjected to the effect of a high work function of the aluminum film, and its work function becomes high in its contact window 14.

In the solid-state image pickup device, herein, the vertical CCD register part of the buried channel structure is used. Hence, if the value of the work function of the polysilicon electrode 9 varies, the potential depth of the buried channel itself is changed. That is, when a eutectic mixture of polysilicon electrode 9 and aluminum wiring is formed, the potential depth of the buried channel formed beneath the contact window 14 becomes shallow. As a result, the transfer efficiency of signal charge may deteriorate, or the maximum amount of signal charge that can be transferred may decrease. In particular, when used in the environments of low illumination, it is hard to recognize the images of the solid-state image pickup device.

Besides lining with the aluminum film, it has also been considered to increase the doping dose of phosphorus in the polysilicon electrode a to lower the resistance to transfer at a higher speed. However, the polysilicon oxide film 10 is formed by oxidizing the polysilicon electrode 9 which has a low resistance. The polysilicon electrode 9 of low resistance has accelerated oxidation, thereby resulting in a greater film thickness of the polysilicon oxide film 10. More specifically, the polysilicon oxide film 10 is a second gate oxide film of the polysilicon electrode 9 of the first layer. Hence, the gap is widened between the polysilicon electrode 9 of the first layer and the polysilicon electrode 9 of the second layer because of the increased thickness of the polysilicon oxide film 10. When the gap is widened, the fringing electric field can hardly act in the CCD register part formed from the polysilicon electrode 9 of the first layer to beneath the polysilicon electrode 9 of the second layer. It leads, accordingly, to deterioration of transfer efficiency between the CCD register part formed beneath the polysilicon electrode 9 of the first layer and the CCD register part formed beneath the polysilicon electrode 9 of the second layer.

On the other hand, in order to avoid deterioration of the transfer efficiency the film thickness of the polysilicon oxide film 10 of the first layer, which becomes the second gate oxide film, can be reduced by oxidizing a polysilicon film having a higher phosphorus doping dose than in the prior art mentioned above However, the crystallinity of the oxide film formed by this accelerated oxidation is coarse, and the film quality is poor. Accordingly, such polysilicon oxide film 10 has a dielectric breakdown voltage of about 20 to 30% lower than the film formed without accelerated oxidation. Therefore, the polysilicon oxide film 10 format by accelerated oxidation which has a film thickness similar to the conventional polysilicon oxide film 10 has dielectric breakdown voltage which is deteriorated by about 20 to 30% and which causes the reliability of the solid-state image pickup device to be lowered. Hence, when it is desired to increase the speed of transfer by lowering the resistance of the polysilicon film, the transfer efficiency characteristic and dielectric breakdown voltage characteristic are in mutually contradictory relation. In other words, it not practicable to satisfy these two characteristics simultaneously.

Besides, as the solid-state image pickup device is further downsized, the size of the contact window 14 formed in the polysilicon electrode 9 and aluminum wiring is becoming smaller. Accordingly, when depositing the aluminum film in the contact window 14 by the sputtering method, the step coverage of the aluminum film is not favorable. As a result, a region of a thin film thickness of the aluminum wiring occurs in the step portion of the contact window 14. In such region of aluminum wiring, the light passes, and the effect as the light-shield film decreases. Thus, the lightshield performance of the aluminum wiring deteriorates and light gets into the polysilicon electrode 9 beneath the contact window 14 and in the buried channel beneath it, so that the smear noise characteristic is impaired.

The invention is intended to solve the above problems, and it is an object thereof to present a solid-stage image pickup device exhibiting a high transfer efficiency and an excellent smear noise characteristic even at a low illumination.

SUMMARY OF THE INVENTION

The invention presents a solid-state image pickup device, including a plurality of photoelectric converting parts having a first gate electrode and a second gate electrode located adjacent to the photoelectric converting parts. The first gate electrode and second gate electrode are formed in overlap. A matrix including a plurality of the first and second gate electrodes and the photoelectric converting parts is formed on a substrate. A region couples the plurality of first gate electrode, second gate electrode and photoelectric converting parts into the matrix configuration. Wirings composed of a film including silicon, and a refractory metal or refractory metal silicide are then formed in a contact window provided in either the first gate electrode or the second gate electrode. The wirings are also formed in other regions of the photoelectric converting parts which have been provided with a contact window.

Moreover, the invention presents a solid-state image pickup device including photoelectric converting parts, and vertical shift registers formed in a semiconductor substrate for transferring the electric charge generated in the photoelectric converting parts. A gate dielectric film is also formed on the semiconductor substrate. A gate electrode is then formed on the gate dielectric film and a contact window is formed in the dielectric film formed on the gate electrode. Wirings including a film of silicon and a refractory metal or refractory metal silicide in this order, are provided in the contact window.

Furthermore, the invention presents a manufacturing method of a solid-state image pickup device comprising a step of forming photoelectric converting parts and a vertical shift register part on a semiconductor substrate so as to form gate electrodes on the vertical shift register part; a step of oxidizing the surface of the gate electrode to form an oxide film; a step of growing a dielectric film on the oxide film; a step of forming a contact window by opening a specific region of the oxide film and dielectric film; a step of forming two or more layers of wirings composed of at least a film including silicon and a refractory metal so as to connect the wirings and the gate electrodes; a step of depositing an interlayer dielectric film on the semiconductor substrate and then depositing an aluminum film.

According to the constitution described herein, since the polysilicon electrode of the driving electrode is lined with low resistance wiring materials of two layers or more composed of, for example, polysilicon film and refractory metal or refractory metal silicide, the resistance of the polysilicon electrode can be ignored, and the solid-stage image pickup device can operate at high speed.

Incidentally, since the wiring material is composed of two or more layers of lining having a polysilicon film in the lower layer, its material is the same as the polysilicon electrode of the base material. Therefore, even after lining, the work function of the polysilicon electrode is not changed at all, and the potential depth of the vertical CCD register part and accumulated part is unchanged and the same as for the other electrodes. It means that a high transfer efficiency is realized at low illumination, in particular. At the same time, local positions prone to entrance of light can be eliminated by the high light-shield property of the refractory metal or refractory metal silicide and the favorable step coverage in the step part of the lining contact. Hence, a preferable smear noise value is presented.

DESCRIPTION OF THE PREFERRED EMBODIMENTS

Figure 1:
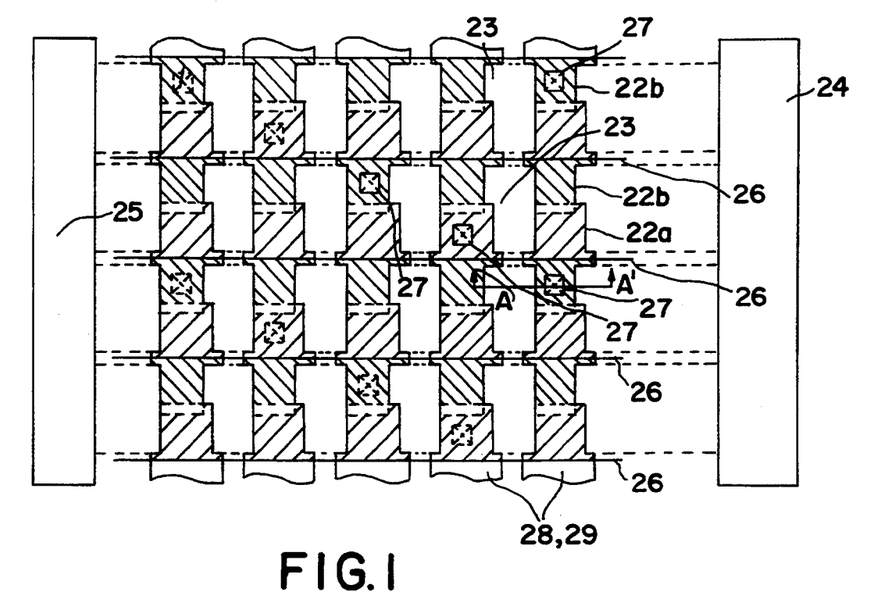
FIG. 1 is a plan view of a solid-state image pickup device according to an exemplary embodiment of the invention.
Figure 2:
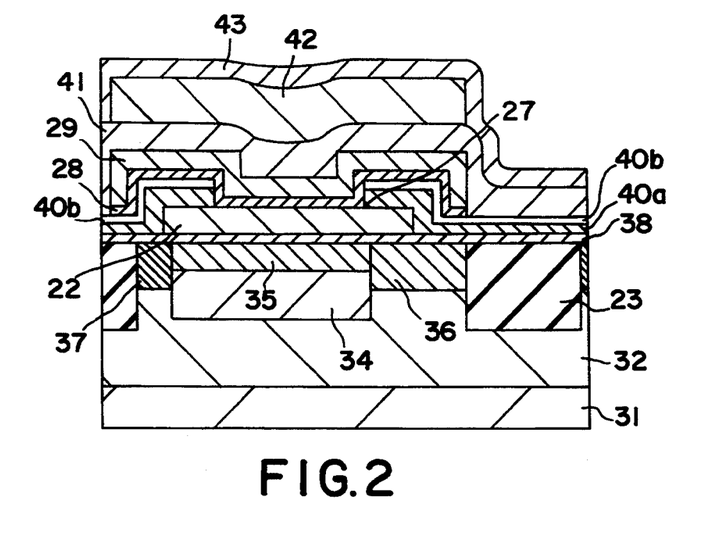
FIG. 2 is a sectional view of a solid-state image pickup device according to an exemplary embodiment of the invention.

Referring now to the drawings, an embodiment of the invention is described in detail below. FIG. 1 is a structural plane view for explaining the invention. FIG. 2 is a sectional structural view of A—A' in FIG. 1.

In FIG. 1, polysilicon electrodes 22a and 22b are formed in matrix configuration on the upper surface of a semiconductor substrate 21. The polysilicon electrodes 22a are disposed with photoelectric converting parts 23 running in the lateral direction of the sheet of paper. The polysilicon electrodes 22a, 22b are electrically connected with the polysilicon electrodes 22a, 22b adjacent in the lateral direction. Pulse driving circuits 24, 25 are disposed at the rightmost end and leftmost end of the polysilicon electrodes 22a, 22b. From the right end pulse driving circuit 24, the polysilicon electrodes 22a, 22b are connected with polysilicon electrode groups arranged in the lateral direction, and are finally linked to the left end pulse driving circuits 25. The provision of the two pulse driving circuits 24, 25 is intended to enhance the transfer efficiency. That is, when pulses are applied to a plurality of polysilicon electrodes 22a, 22b in the lateral direction from one pulse driving circuit 24, the pulse waveform becomes gradually dull as propagating through the polysilicon electrodes 22a, 22b. Therefore, by applying the same signal from the two driving circuits 24, 25, dull deformation of pulses due to propagation may be prevented. Three signal potentials are generated from the pulse driving circuits 24, 25, that is, H (high), M (medium), and L (low).

In the vertical direction of the sheet of paper, adjacent polysilicon electrodes 22a and adjacent polysilicon electrodes 22b are overlapped and formed in the vertical direction. In manufacturing of the polysilicon electrodes 22a another polysilicon electrode 22b formed on the part of one polysilicon electrode by self-alignment. As a result, overlap regions are formed in the polysilicon electrodes 22a, 22b.

The shape of the polysilicon electrodes 22a, 22b is line symmetrical on a dielectric film 26 and the area of the upper polysilicon electrodes 22a is greater than that of the lower ones. It is the polysilicon electrodes 22a formed in the upper part from the dielectric film 26 that are responsible for transferring the electric charge generated in the photoelectric converting parts 23 into the vertical CCD register part formed in the semiconductor substrate beneath the polysilicon electrodes 22a, 22b. Accordingly, for the ease of photoelectric converting parts 23, the polysilicon electrodes 22a responsible for transferring are installed of this, the area of the polysilicon electrodes 22a, 22b differs above and beneath the dielectric film 26.

Contact windows 27 are formed the polysilicon electrodes 22a, 22b. The contact windows 27 are formed, in the vertical direction on the sheet of paper, on every other see of the upper polysilicon electrodes 22a and lower polysilicon electrodes 22b formed on the dielectric film 26. That is, grouping four polysilicon electrodes 22a, 22b as one set forms a solid-state image pickup device of so-called four-phase drive type for applying a specific potential to them from the pulse driving circuits 24, 25. In this case, all polysilicon electrodes 22a, 22b in the contact window 27 forming area are at a same potential electrically, and two out of the four polysilicon electrodes 22a, 22b formed continuously in the vertical direction are always identical in potential, while the other two polysilicon electrodes 22a, 22b are applied with mutually different potentials, also different from the above two potentials.

in the lateral direction on the sheet of paper, on the other hand, the contact windows 27 are formed in stairs. More specifically, the contact windows 27 formed in the right end region in the diagram are formed in a lower region on the dielectric film 26, while the left side contact windows 27 are formed in the adjacent polysilicon electrodes 22a, 22b, and in an upper region across the dielectric film 26. At the left side, further, the contact window 27 is formed in a lower region across line A, with respect to the right end polysilicon electrodes 22a, 22b and the polysilicon electrode 22 shifted by one position in the vertical direction on the sheet of paper. Furthermore, the next left side contact window 27 is formed in an upper region across the dielectric film 26, in the left side polysilicon electrodes 22a, 22b.

The polysilicon electrodes 22a, 22b formed in matrix are composed of a series of polysilicon electrode groups in the vertical direction on the sheet of paper, and polysilicon films 28 and refractory metal 29 so as to cover a series of contact window groups. The end portions of the polysilicon film 28 and refractory metal 29 are formed so that the surface area of the photoelectric converting parts 23 may be as wide as possible.

Referring then to FIG. 2, the structure of the solid-stage image pickup device is described more specifically below.

First of all, a p type well 32 is formed on a semiconductor substrate 31. As the semiconductor substrate 31, an n⁻ type silicon substrate of plane azimuth (100) is used. The impurity concentration of the semiconductor substrate 31 is about $10^{14}$ cm$^{-3}$, and the depth of p type well 32 is about 5 μm. The impurity concentration of the p type well 32 is about $10^{15}$ cm$^{-3}$. The p type wells 32 are provided in order to discharge the overflow charge in the photoelectric converting parts. That is, in the photoelectric converting parts formed on the semiconductor substrate 31, electric charges are formed by the light entering from outside, and are temporarily stored inside. If the electric charge amount becomes larger than the charge that can be accumulated in the photoelectric converting parts, the excess portion flows from the photoelectric converting parts into other region. If such charge gets into the vertical CCD register part, it may cause blooming. Occurrence of such blooming may be prevented by forming p type wells 32. The p type wells 32 are fixed at zero volts. Accordingly, in the potential distribution formed in these regions, the charge generated in the photoelectric converting parts is discharged onto the semiconductor substrate 31 through the p type wells 32. When the impurity concentration of the p type wells 32 is set at the value specified above, the photo diodes may be easily depleted at the time of operation of the solid-state image pickup device, and the quantity of photoelectric converting signal charge in the photoelectric converting parts may be increased. The depth of the p type wells 32 is determined by the depth of the photoelectric converting parts and the dielectric breakdown voltage between the two. The depth of the photoelectric converting parts is required to be about 2 μm in order to obtain a sufficient photoelectric conversion efficiency at the time of incidence of light in the visible light region.

In the p type wells 32, n⁻ type diffusion layer regions 33 are formed as photoelectric converting parts. When light enters the n⁻ type diffusion layer regions 33, electron and hole pairs are generated in the depletion layer of the n⁻ type diffusion layer region 33. The electron becomes a signal charge through the adjacent vertical CCD register part. The hole is taken out of the semiconductor substrate 31 through the p type wells 32. In this way, the photoelectric converting parts convert the incident light into a signal charge.

In the p type wells 32, p type diffusion layer regions 35 are formed. The p type diffusion layer regions 35 act to prevent diffusion of the electric charge, which may become noise, out of the signals generated in the semiconductor substrate 31 from diffusing into the vertical CCD register part. The diffusion depth of the p type diffusion layer region 35 is about 1 μm. The impurity concentration of the p type diffusion layer region 35 is $10^{16}$ cm$^{-3}$.

The p type diffusion layer regions 35 are used for enclosing the n type diffusion layer regions 34 which become CCD register parts. Generally, such structure is known as Hi-C structure. When the diffusion depth of the p type diffusion layer region 35 is set deeper by heat treatment, diffusion in the lateral direction is promoted at the same time. Accordingly, the p type diffusion layer regions 35 advance up to the n⁻ type diffusion layer regions 33 in the photoelectric converting parts. When the n⁻ diffusion layer regions 33 get into the photoelectric converting parts, the output of the photoelectric converting parts is lowered.

The vertical CCD register parts are composed of n type diffusion layer regions 34. The vertical CCD register parts are the transfer regions for transferring the signal charge formed in the photoelectric converting parts into a specific region.

The diffusion depth of the n type diffusion layer region 34 is about 0.5 μm. The impurity concentration in the n type diffusion layer regions 34 is $10^{16}$ to $10^{17}$ cm$^{-3}$.

In the diagram, beach ends of the p type diffusion layer region 35 and n type diffusion layer region 34 are necessary to extend one width of the p type diffusion layer region 35. When transferring the signal charge generated in the photoelectric converting parts from the photoelectric converting parts to the vertical CCD register pares, the potential of the vertical CCD register parts is set lower than the potential of the photoelectric converting parts. If, incidentally, the signal charge carried to the vertical CCD register parts flows back to the photoelectric converting parts, or the signal charge is present in the vertical CCD register parts parts, it is necessary to prevent the signal charge formed in the photoelectric converting parts from flowing into the vertical CCD register parts. For this purpose, p⁺ type diffusion layer regions 36 for controlling the transferring potential height are formed between the photoelectric converting parts and the vertical CCD register parts. When the signal charge is transferred from the photoelectric converting parts to the vertical CCD register parts, the potential height in the p⁺ type diffusion layer regions 36 is set lower than the potential height in the photoelectric converting parts, and the same as or slightly higher than the potential height in the vertical CCD register parts. When signal charges are accumulated in the vertical CCD register parts, the potential in the p⁺ type diffusion layer regions 36 is set higher than the potential in the photoelectric converting parts, and also higher than the potential in the vertical CCD register parts, so that the signal charges may not flow back into the photoelectric converting parts.

Herein, the depth of the p⁺ diffusion layer regions 36 is about 1 μm. The surface concentration of the p⁺ diffusion layer regions 36 on the silicon substrate surface is $10^{16}$ to $10^{17}$ cm$^{-3}$.

When the operating voltage of the solid-state image pickup device is zero volts or 15 volts, it is necessary to prevent the signal charge flowing back from the vertical CCD register pares to the photoelectric converting parts, or to allow the charge to flow into the vertical CCD register parts from the photoelectric converting parts. Accordingly, the depth and impurity concentration of the p⁺ diffusion layer regions 36 are determined so that the threshold voltage is adjusted for achieving an optimum potential distribution in each state. The width of the p⁺ type diffusion layer regions 36 should be about 1 μm or less. If the width of the p⁺ type diffusion layer regions 36 is greater than 1 μm, the gm characteristic of the transistor is impaired. If the gm characteristic is impaired, it is impossible to transfer the signal charges accumulated in the photoelectric converting parts completely. To the contrary, if the width of the p⁺ type diffusion layer regions 36 is less than about 1 μm, a short channel effect takes place. Because of the short channel effect punch is likely to occur. This results in a smaller output value of the photoelectric converting parts.

In the solid-state image pickup device, photoelectric converting parts and vertical CCD register parts form pairs, which are formed in a matrix. To separate a pair and an adjacent pair electrically, p⁺⁺ type diffusion layer regions 37 are formed. The p⁺⁺ type diffusion layer regions 37 are formed by ion implantation.

Herein, the depth of the p⁺⁺ type diffusion layer regions 37 is about 1 μm. The surface concentration of the p⁺⁺ type diffusion layer regions 37 is $10^{17}$ to $10^{18}$ cm$^{-3}$.

The surface concentration of the p⁺⁺ diffusion layer region 37 must be set in a specified range in order that the signal charge accumulated on the adjacent photoelectric converting parts may not flow in. If the surface concentration is less than $10^{17}$ cm$^{-3}$ the signal charge in the adjacent photoelectric converting parts may flow in. Or if the surface concentration is more than $10^{18}$ cm$^{-3}$ a narrow channel effect takes place in the adjacent n type diffusion layer regions 34. As a result of the narrow channel effect, the capacity of the transfer portions of the vertical CCD register parts is lowered. Hence, the dynamic range of the solid-state image pickup device becomes small, and the transfer efficiency is impaired.

The width of the p⁺⁺ diffusion layer regions 37 should be preferably about 1 μm or less. If the width of the p⁺⁺ diffusion layer regions 37 is more than 1 μm, the transfer regions decrease. It is therefore impossible to transfer completely the signal charges accumulated in the photoelectric converting parts. On the other hand, if the width of the p⁺⁺ type diffusion layer regions 37 is less than 1 μm, a short channel effect occurs. Because of the short channel effect, punch-through is likely to occur between the adjacent photoelectric converting parts and the vertical CCD register parts. As a result, the information of the adjacent photoelectric converting parts is transferred, and the resolution is lowered. Moreover, the output of the photoelectric converting parts is lowered.

On the semiconductor substrate 31, a gate oxide film 38 is grown. The gale oxide film 38 is formed by pyrogenic oxidation. The film thickness of the gate oxide film 38 is about 50 nm or less. To raise the transfer efficiency, the film thickness of the gate oxide film 38 is desired to be set at 50 nm or more. Polysilicon electrodes 39 are formed by a low pressure CVD process. The sheet resistance of the polysilicon electrodes 39 is about scores of ohms. The film thickness of the polysilicon electrodes 39 is about 500 nm. The polysilicon electrodes 39 are used as the electrodes for applying high frequency pulses for transferring the signal charges formed in the photoelectric converting parts into the vertical CCD register parts. Thus, the polysilicon electrodes 39 are desired to be as low in resistance as possible. On the surface of the polysilicon electrodes 39, a polysilicon oxide film 40a obtained by thermal oxidation process is grown.

The polysilicon oxide film 40a is formed by pyrogenic oxidation method. The film thickness of the polysilicon oxide film is about 200 nm. The polysilicon oxide film 40a is formed for assuring the dielectric breakdown voltage of the interlayer film. To guarantee the dielectric breakdown voltage securely, a dielectric film 40b is formed on the polysilicon oxide film 40a. Since the residue of the polysilicon film is formed by etching forming the polysilicon electrode 39 leaks occur through the etching residue of the polysilicon film when a driving voltage is applied. The polysilicon oxide film 40a and dielectric film 40b are formed to prevent such leak.

On the surface of the dielectric film 40b, an interlayer dielectric film 41 is formed by CVD process. The film thickness of the interlayer dielectric film 41 is about 100 nm. The interlayer dielectric film 41 together with the polysilicon oxide film 40a and dielectric film 40b, are responsible for electric insulation of the refractory metal 46 used as wiring material and the polysilicon electrodes 39. The applied high frequency pulses are $-7$ V, 0 V, and $+15$ V, and the dielectric breakdown voltage is more than a maximum voltage difference of 22 V. Yet, since the interlayer dielectric film 41 should prevent etching residue of the polysilicon films 45 and refractory metal 46 by improving the seep coverage in the step portion, the low pressure CVD method should be preferably applied, rather than the atmospheric CVD method.

The contact windows 44 are formed in specific regions on the polysilicon electrode of the first layer and the polysilicon electrode of the second layer in order to realize four-phase driving of the solid-state image pickup device. The opening of the contact windows 44 is about 1.5 μm×1.5 μm, as compared with about 3 μm×3 μm of the polysilicon electrodes of the base material, so that both sufficient design margin and favorable contact characteristic may be satisfied at the same time.

After forming contact windows 44, a phosphorus-doped polysilicon film 45 is grown on the entire surface on the interlayer dielectric film 41 in a thickness of about 100 nm. At this time, precaution must be taken so that a native oxide film may not be formed on the interface with the base polysilicon electrode 39. The temperature during polysilicon growth and phosphorus doping is low, 900° C. or less, and the impurity profile in the semiconductor substrate 31 is hardly changed.

The refractory metal 46 is grown. In the exemplary embodiment of the invention, a tungsten silicide film grown by CVD method was used. The film thickness of tungsten silicide film is about 200 nm.

It is essential to increase the thickness of the tungsten silicide film in order to decrease smear noise (improve the light-shield characteristic of tungsten silicide film). However, considering the processing of the tungsten silicide film 47 in a later process, the film thickness was set at 200 nm. At a film thickness of 200 nm, the transmittance is 0.01%. Owing to the characteristic that the step coverage of the tungsten silicide film formed by the CVD process is excellent, the tungsten silicide film deposits into the sidewall of the contact windows 44 in a uniform film thickness in a similar manner as the polysilicon films 45 mentioned above. In particular, the film thickness is not decreased in the step portion, but a high light-shield performance is exhibited as in the case of a flat film. As a result, the transmittance of 0.01% at 200 nm is maintained in the step portion of the contact. The lower layer of the wiring material used as light-shield film has a phosphorus-doped polysilicon film 45. A change of work function of the gate electrodes due to the diffusion of aluminium does not occur. This was experienced when the phosphorus-doped polysilicon film 45 was applied in the wiring material lined with aluminum film 42. In the solid-state image pickup device, when the work function of the gate electrode made of polysilicon is changed, the potential depth of the signal charge transfer route formed fatal image deteriorations such as lowering of transfer efficiency and fixed pattern noise.

The wiring materials composed of polysilicon film 45 and tungsten silicide film are simultaneously removed by etching. The wiring width is about 4.0 μm, and the polysilicon electrodes 39 are completely shielded [of] from light by covering the polysilicon electrodes 39. The wirings make contact with the aluminum wirings in the pixel portions, that is, in the peripheral parts of the photoelectric converting parts, so[,] that driving pulses can be applied to the tungsten silicide film 46 and polysilicon film 45. The specific resistance of the tungsten silicide film is 1/10 or less of the phosphorus doped polysilicon.

In this embodiment the sheet resistance of the tungsten silicide film of about 200 nm thickness is about $\Omega/\square$, which is known to be 1/5 of the sheet resistance (about 25 $\Omega/\square$) of the polysilicon electrode 39 of about 400 nm thickness. If the sheet resistance of the polysilicon electrode 39 is high, a sufficiently high frequency pulse is not applied to the polysilicon electrode 39 which is the driving electrode. This results in deterioration of transfer efficiency in particular, in the solid-state image pickup device for transferring high frequency pulses (750 kHz) by frame interline transfer method or the like, deterioration of transfer efficiency is significant.

Figure 3:
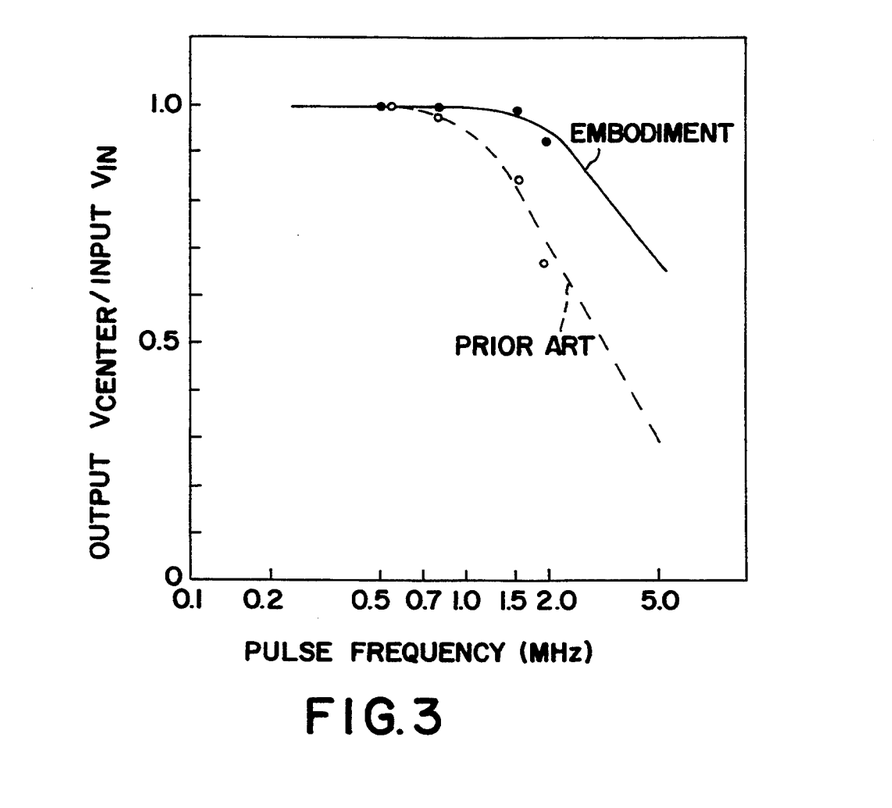
FIG. 3 is a diagram showing transfer frequency characteristics of a solid-state image pickup device according to an exemplary embodiment of the invention.

Experimental data is shown in FIG. 3. The axis of ordinates denotes the output which is the ratio of the voltage of the pulse in the middle of the solid-state image pickup device to the voltage of the driving pulses applied from both-ends of the transfer gate of the vertical CCD register parts. The axis of abscissas represents the frequency of the pulse. The broken line in the diagram shows the connection of the aluminum film as light-shield film to the polysilicon electrode in the conventional solid-state image pickup device. The solid line indicates that the aluminum film is formed after forming polysilicon film and refractory metal on the polysilicon electrodes explained in this embodiment. In the conventional solid-state image pickup device, from around 0.7 MHz, the voltage is small in the middle of the solid-state-image pickup device, and the pulse is deformed. In the solid-state image pickup device of the embodiment, it is known that the pulse voltage is not lowered even around 1.5 MHz, which is more than twice as high as the conventional frequency.

The interlayer dielectric film 41 is formed in the same manner as in the prior art, and the aluminum film 42 is patterned and left over in the pixel parts as light-shield film, and in the peripheral parts as wiring material. The asperities of the contact window 44 between the tungsten silicide film and polysilicon electrode 45 are flattened by the interlayer dielectric film 41 and the polysilicon film 45 as a silicon film buried in contact window 44, and the tungsten silicide film 46. Hence, the aluminum film 42 is formed on a nearly flat base surface.

In the invention, in particular, since the polysilicon film 45 and tungsten silicide film are grown by the CVD process, the step coverage in the contact windows 44 is superior. For example, when the contact size is reduced to about 1 $\mu$m × 1 $\mu$m, the contact windows 44 are completely buried, and a nearly perfect flat layer may be obtained.

When the contact windows 44 are buried in the tungsten silicide film, the interlayer dielectric film 41 used for flattening may be reduced in film thickness. The conventional flattening process required a film thickness of about 400 nm, but it is adequate to grow a film about 200 nm, which is a film thickness for assuring an electric breakdown strength (22 V). Thinning of the interlayer dielectric film 41 shortens the distance between the aluminum film 42 as the light-shield film and the tungsten silicide film. Therefore, it is possible to decrease the light entering the tungsten silicide film from an oblique direction, so that the smear noise decreases. Moreover, since the aluminum film 42 is grown on a flat base surface, cracks will not be formed in the step portion. The aluminum film 42 exhibits general characteristics of high light-shield performance, and does not transmit light at all. That is, the smear noise may be notably decreased by employing a two-layer light-shield structure of tungsten silicide film and aluminum film 42.

According to the embodiment, as described herein, after forming contact windows 44 in desired regions of the polysilicon films 40a and dielectric films 40b grown by the CVD process or the like, they are brought to contact with polysilicon electrodes 39 of driving electrodes with wiring materials in two or more layers composed of silicon films, for example, polysilicon film and refractory metal or refractory metal silicide. Consequently, the polysilicon electrodes 39 are lined with refractory metal with low electric resistance. Further, by covering the polysilicon electrodes 39 of driving electrodes completely with two layers or more of wiring materials low in optical transmittance, incidence of light into the vertical CCD register parts is suppressed.

In this constitution, moreover, since the polysilicon electrodes 39 of driving electrodes are lined with two or more layers of low resistance wiring materials, for example, polysilicon film 45 and refractory metal 46 or refractory metal silicide film, the resistance of the polysilicon electrodes 39 can be ignored, and the solid-stage image pickup device can operate at high speed.

The wiring materials with two or more layers for lining are polysilicon films 45 in the lower layer which are the same material as the polysilicon electrodes 39 of the base. Therefore, after lining with aluminum film 42, the aluminum will not diffuse to vary the work function of the polysilicon electrodes 39. Hence, the potential depth of the vertical CCD register parts and signal charge transfer routs beneath storage parts are not changed and remain the same. It means, in particular, that the transfer efficiency of signal charge at low illumination can be enhanced. In addition, the high light-shield performance of the refractory metal 46 and refractory metal silicide film, and the favorable step coverage in the lined contact windows 44, enable local positions prone to incidence of light to be eliminated, and smear noise to be decreased. As a result of the improved characteristics, the invention realizes a solid-state image pickup device with high transfer efficiency and low smear noise.

By employing this structure at 750 kHz which is the driving frequency of the vertical CCD register parts of the solid-state image pickup device of frame interline transfer system, the low illumination transfer efficiency is improved from the conventional 85% to 95%, and the smear noise from 0.1% to 0.01%.

In an exemplary embodiment of the present invention, meanwhile, tungsten silicide film is used as the refractory metal 46, but the smear noise characteristic may be further enhanced by using, for example, molybdenum silicide film or tungsten film with higher light-shield performance.

Similarly, in an exemplary embodiment of the present invention, a dielectric film of oxide film compound is used in the lower layer of wiring material composed of refractory metal 46, but the smear noise may be also decreased by reducing the film thickness by using, for example, a silicon nitride film with high insulating performance.

Structurally, the same effects may be obtained not only in the solid-state image pickup device of frame interline transfer system, but also in that of interline transfer system. This is because the frame interline CCD system is a structure realized by adding storage parts newly to the interline CCD system. That is, it is composed of the image pickup unit (combining the photoelectric converting parts, and vertical CCD register parts), storage parts and horizontal CCD register parts. Thus, in the frame interline transfer system, although the configuration of elements is somewhat different from the interline transfer system, the same effects can be obtained, as a matter of course, by composing the vertical CCD register parts according to the embodiment.

The manufacturing method of an exemplary embodiment of the present invention is described below while referring to FIGS. 4 to 10.

Figure 4:
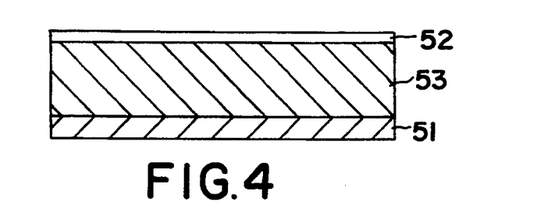
FIG. 4 is a process sequential sectional diagram of a solid-state image pickup device according to an exemplary embodiment of the invention.

To start, as in the case of the conventional solid-state image pickup device, a thermal oxide film 52 of about 100 nm is formed on the principal surface of an n type semiconductor substrate 51. Boron ions are implanted on the entire surface of the semiconductor substrate 51 through the thermal oxide film 52. Afterwards, a p type well 53 is formed by heat treatment. This heat treatment is conducted for several hours at a heat treatment temperature of 1100° C. or more in a nitrogen atmosphere. This heat treatment actuates the implanted boron ions (FIG. 4).

Figure 5:
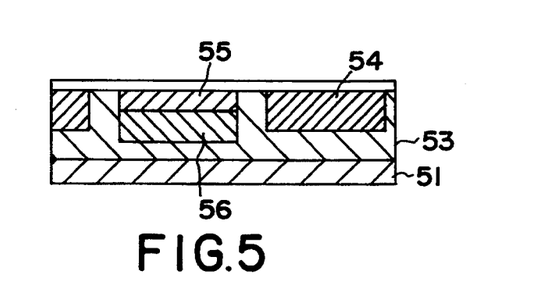
FIG. 5 is a process sequential sectional diagram of a solid-state image pickup device according to an exemplary embodiment of the invention.

Consequently, a photo resist is deposited on the semiconductor substrate 51 (not shown). Next, an n⁻ type diffusion layer region 54 for forming photoelectric converting parts is exposed and developed, and a resist pattern is formed. Using the resist pattern as the mask, phosphorus ions are implanted. The ion implantation condition at this time is an acceleration voltage of hundreds of keV and ion dose of about $10^{12}$ cm⁻². At this time, heat treatment is conducted in nitrogen atmosphere. As a result, the depth of the n⁻ type diffusion layer region 54 is about 2 μm. In this way, the n⁻ type diffusion layer region 54 is formed as photoelectric converting parts in a specific region of the p type well 53. In the next step, the resist pattern on the semiconductor substrate 51 is removed, and the photo resist is deposited again on the semiconductor substrate 51 (not shown). By exposing and developing the p type diffusion layer region 55, a resist pattern is formed. Using this resist pattern as a mask, boron ions are implanted.

At this time, the ion implantation condition is an acceleration voltage of about 100 keV and ion dose of about $10^{12}$ cm⁻². As a result the final diffusion depth of the p type diffusion layer region 55 is about 1 μm.

Thus is formed, in the p type well 53, the p type diffusion layer region 55 for preventing the noise charge from diffusing into the vertical CCD register parts when noise may be generated in the semiconductor substrate 51. Moreover, using the resist pattern as a mask, phosphorus ions are implanted. At this time, the ion implantation condition is an acceleration voltage of about 100 keV and ion dose of $10^{12}$ cm⁻². Consequently, the diffusion depth of the n type diffusion layer region 56 is about 0.5 μm. In this way, the n type diffusion layer region 56 as vertical CCD register part is formed (FIG. 5).

Figure 6:
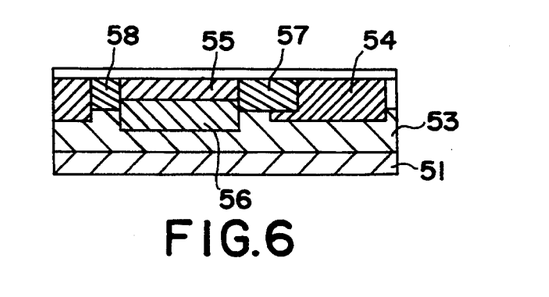
FIG. 6 is a process sequential sectional diagram of a solid-state image pickup device according to an exemplary embodiment of the invention.

Next, the resist pattern on the semiconductor substrate 51 is removed and the photo resist is deposited again on the semiconductor substrate 51 (not sown). By exposing and developing the p⁺ type diffusion layer region 57, a resist pattern is formed. Using this resist pattern as a mask, boron ions are implanted.

At this time, the ion implantation condition is an acceleration voltage of about hundreds of keV and ion dose of $10^{12}$ cm⁻². As a result the depth of the p⁺ type diffusion layer region 57 is about 1 μm. By implanting in such conditions, the threshold voltage between the photoelectric converting parts and vertical CCD register parts can be controlled. The p⁺ type diffusion layer region 57 for controlling the transferring potential is formed between the photoelectric converting parts and the vertical CCD register parts.

The resist pattern on the semiconductor substrate 51 is then removed and a new photo resist is deposited again on the semiconductor substrate 51 (not shown). By exposing and developing the p⁺⁺ type diffusion layer region 58, a resist pattern is formed. Boron ions are implanted in this resist pattern.

At this time, the ion implantation condition is an acceleration voltage of about hundreds of keV and ion dose of $10^{13}$ cm⁻². As a result the depth of the p⁺⁺ type diffusion layer region 58 is about 1 μm.

Since the p⁺⁺ type diffusion layer region 58 separates from adjacent elements, the threshold voltage is heightened so as not to conduct the voltage applied at the time of operation. For this purpose, the impurity concentration of the p⁺⁺ type diffusion layer region 58 is set relatively high. In particular, it should be higher than the impurity concentration of the p⁺ type diffusion layer region 57 (FIG. 6).

Figure 7:
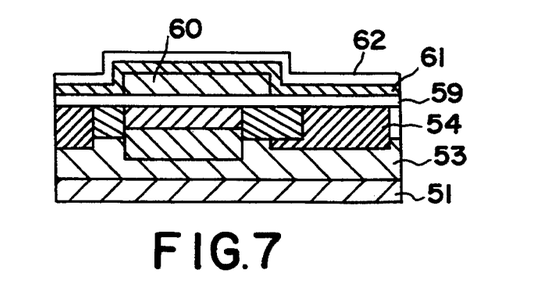
FIG. 7 is a process sequential sectional diagram of a solid-state image pickup device according to an exemplary embodiment of the invention.

Next, a gate oxide film 59 is grown in a thickness of about 50 nm by pyrogenic oxidation method.

A polysilicon film is grown to about 500 nm by low pressure CVD method, and the sheet resistance is adjusted to about 20Ω by phosphorus doping. The polysilicon electrode 60 has the same structure as the prior art electrode. Next, a polysilicon oxide film 61 is grown to about 200 nm on the polysilicon electrode 60 by thermal oxidation. To prevent dielectric breakdown due to pin holes in the polysilicon oxide film 61, a dielectric film 62 of silicon-oxide film having a thickness of about 100 nm is deposited on the polysilicon oxide film 61 by low pressure CVD method. The polysilicon oxide film 61 has a film thickness of 200 nm in order to prevent leak between solid. A silicon oxide film using TEOS gas was deposited in the dielectric film 61 of the silicon oxide film. At a film thickness of 100 nm of the dielectric film 62, the breakdown voltage can be improved to 30 V or more.

It is, meanwhile, desirable to improve the step coverage in the step portion as the measure for durability. The growth method of dielectric film is usually the low pressure CVD method, rather than the atmospheric CVD method. By mask matching and etching process, contact windows 63 are formed. The contact windows are formed in desired regions on the polysilicon electrode of the first layer and polysilicon electrode of the second layer in order to realize four-phase drive operation of the solid-state image pickup device.

Figure 8:
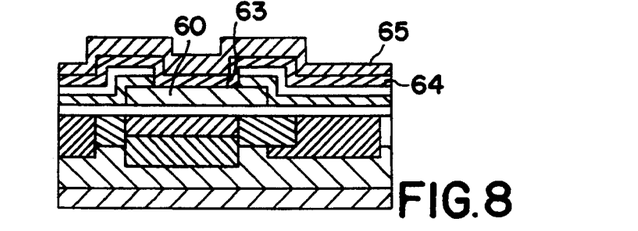
FIG. 8 is a process sequential sectional diagram of exemplary embodiment of the invention.

After forming contact windows 63, the phosphorus-doped polysilicon film 64 is grown by about 100 nm. At this time, due care should be required so that a native oxide film may not remain in the interface between polysilicon film 64 and the undercoat polysilicon film 60. The film thickness of the polysilicon film 64 is 100 nm because if the thickness is thinner the polysilicon film 64 may be peeled off by the stress of the tungsten silicide film 65, which is deposited in a later process.

The temperature during the polysilicon growth and phosphorus doping is low, 900° C. or less, and the impurity profile in the diffusion layer in the silicon substrate during this time is hardly changed. If the impurity profile is diffused and changed by heat, it may lead to lowering of transferring characteristic or saturation output value of the solid-state image pickup device.

Consequently, by the CVD method, for example, tungsten silicide film 65 is grown by about 200 nm. More specifically, it is obtained by reduction reaction of tungsten hexafluoride gas and hydrogen gas (FIG. 8).

Using the CVD method, the tungsten silicide film 65 gets uniformly into the sidewall of the contact windows 63 as the polysilicon film 64 because of the excellent step coverage characteristics. The film thickness is not particularly decreased in the step portion, and a high light-shield performance as in a flat film is exhibited.

Figure 9:
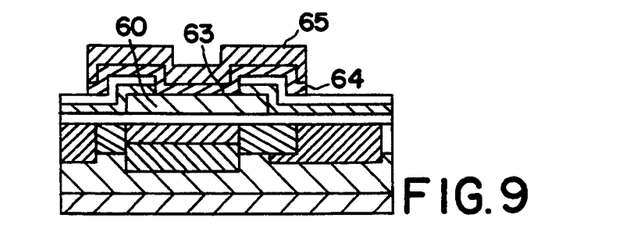
FIG. 9 is a process sequential sectional diagram of a solid-state image pickup device according to an exemplary embodiment of the invention.

Consequently, wiring materials composed of polysilicon film 64 and tungsten silicide film 65 are simultaneously etched and removed by using fluorine type etching gas, and are processed into desired wiring patterns (FIG. 9).

Figure 10:
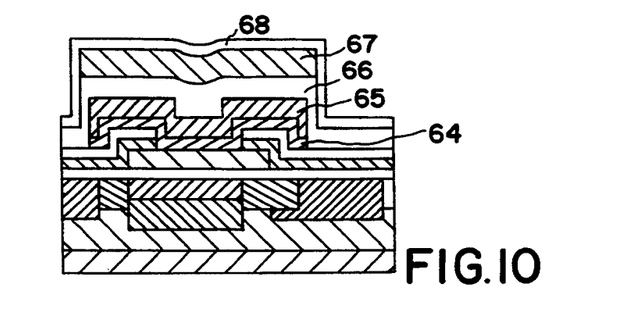
FIG. 10 is a process sequential sectional diagram of a solid-state image pickup device according to an exemplary embodiment of the invention.

An interlayer dielectric film 66 is formed in the same manner as the prior art. An aluminum film 67 used as a light-shield film is patterned and left on the upper parts of the vertical CCD register parts and charge storage parts. Finally, a protective film 68 is formed over the entire surface of the substrate (FIG. 10).

In an exemplary embodiment of the present invention, the tungsten silicide film 65 is used as a refractory metal, but the effect on the smear noise may be improved by using, for example, molybdenum silicide film or tungsten film having a higher lightshield performance.

When using molybdenum silicide film or tungsten film, the film can be formed exactly in the same manner as when forming the tungsten silicide film.

Similarly, in an exemplary embodiment of the present invention, a dielectric film of oxide film is used in the lower layer of the wiring material made of refractory metal. However by using, for example, a silicon nitride film of higher insulation performance, the smear noise may be decreased by reducing the film thickness.

According to an exemplary embodiment of the present invention, by achieving contact between the polysilicon electrode which is a driving electrode and the wiring material composed of refractory metal and by applying transfer pulses to the wiring material, the transfer efficiency at low illumination is improved by more than 10%. By using the silicide film as a light-shield film, the smear noise can be reduced to less than 1/10 of the conventional level. As a result, a solid-state image pickup device of high transfer efficiency and low smear noise characteristic may be realized.

What is claimed is:

1. A solid-state image pickup device comprising:
   a semiconductor substrate;
   a matrix formed on said semiconductor substrate, said matrix having a plurality of matrix components arranged in a matrix configuration;
   each of said plurality of matrix components comprising
   (a) a photoelectric converting part formed in said semiconductor substrate;
   (b) a first gate electrode formed on said semiconductor substrate and positioned adjacent to said photoelectric converting part;
   (c) a second gate electrode formed on said semiconductor substrate and positioned adjacent to said photoelectric converting part so that said first gate electrode and said second gate electrode overlap;
   (d) said first gate electrode and second gate electrode further formed on said substrate so that said first gate electrode and said second gate electrode are in a column;
   one of said matrix components electrically connected with another one of said matrix components so that the first gate electrode in each of the electrically connected matrix components are in a first row and electrically connected and the second gate electrode in each of the electrically connected matrix components are in a second row and electrically connected
   at least one contact window formed in at least one of said first gate electrode and said second gate electrode; and
   wirings formed in at least said contact window, said wirings including a first wiring layer and a second wiring layer formed on said first wiring layer, said first wiring layer comprised of silicon and a second material selected from the group consisting of a refractory metal and a refractory metal silicide and said second wiring layer is a light shield layer for said first wiring layer.

2. A solid-state image pickup device according to claim 1, wherein
   pulse driving circuits are electrically connected to both ends of said row formed by said first gate electrode and said second gate electrode.

3. A solid-state image pickup device according to claim 2 wherein said matrix comprises n columns and m rows of said matrix components, where n and m are integers; and
   said contact window formed in at least one of said first gate electrode and second gate electrode at column l and row k, where l and k are integers and where l and k are $0<l, 1+4<=n$, and $0<k<=m$, wherein a second contact window is formed in row k and column (l+4) in at least one of said first gate electrode and second gate electrode.

4. A solid-state image pickup device according to claim 2, wherein said matrix comprises n columns and m rows of said matrix components, where n and m are integers; and said contact window is formed in at least one of said first gate electrode and said second gate electrode at column l and row k and where another of said plurality of contact windows are formed at column $l+1$ and row $k+1$ where $0<l$ $l+1<=n$, $0<k$, and $k+1<=m$.

5. A solid-state image pickup device according to claim 2, wherein said first wiring layer is formed in regions other than said photoelectric converting parts in said rows.

6. The solid-state image pickup device according to claim 1, wherein said second wiring layer is aluminum.

7. A solid-state image pickup device comprising:
   a semiconductor substrate;
   a plurality of photoelectric converting parts formed in said semiconductor substrate;
   vertical shift registers formed in said semiconductor substrate;
   a gate dielectric film formed on said semiconductor substrate;
   a gate electrode formed on said gate dielectric film;
   an interlayer dielectric film formed on said gate electrode;
   a contact window formed on said gate electrode;
   first wirings formed in at least said contact window, said first wirings comprise a material selected from the group consisting of a refractory metal and a refractory metal silicide formed on silicon; and second wiring formed on said contact windows and through said interlayer dielectric film.

8. A solid-state image pickup device according to claim 7, further comprising:
   said plurality of photoelectric converting parts formed adjacent to each other;
   separating regions formed between each of said adjacent photoelectric converting parts;
   a dielectric film formed on said silicon substrate; and
   said first and second wirings formed on said dielectric film on regions other than said separating regions.

* * * * *